United States Patent [19]

Zwicky

[11] Patent Number: 4,567,443
[45] Date of Patent: Jan. 28, 1986

[54] LOW-DISTORTION AUDIO AMPLIFIER CIRCUIT ARRANGEMENT

[75] Inventor: Paul Zwicky, Dielsdorf, Switzerland

[73] Assignee: Willi Studer AG, Regensdorf, Switzerland

[21] Appl. No.: 708,171

[22] Filed: Mar. 4, 1985

[30] Foreign Application Priority Data

Mar. 21, 1984 [CH] Switzerland ............... 1415/84

[51] Int. Cl.⁴ .................................. H03F 1/26
[52] U.S. Cl. ......................... 330/149; 330/85; 330/79
[58] Field of Search ............... 330/79, 109, 149, 165, 330/171, 85

[56] References Cited

U.S. PATENT DOCUMENTS 3,249,883  5/1966  Berneike et al. ............ 330/85
3,656,831  4/1972  Seidel ........................ 330/85
3,810,256  5/1974  Van Doorn .................. 330/149
3,828,269  8/1974  Norton ....................... 330/97

FOREIGN PATENT DOCUMENTS 0041472 12/1981 European Pat. Off. .

Primary Examiner—James B. Mullins
Assistant Examiner—G. Wan
Attorney, Agent, or Firm—Werner W. Kleeman

[57] ABSTRACT

In amplifier circuit arrangements for low-distortion transmission of audio signals a transformer is provided in order to isolate a source circuit from an amplifier of the amplifier circuit arrangement. Good transmission characteristics, however, can only be obtained in such circuit arrangements by using transformers of comparatively great dimensions. In order to achieve improved transmission characteristics and yet design the transformer in such a manner as to have small size, to be of low weight and inexpensive, the amplifier of the amplifier circuit arrangement is provided with a negative feedback circuit. This negative feedback circuit is connected to the source circuit by using a transformer connected in series with the current-voltage source of such source circuit.

12 Claims, 7 Drawing Figures

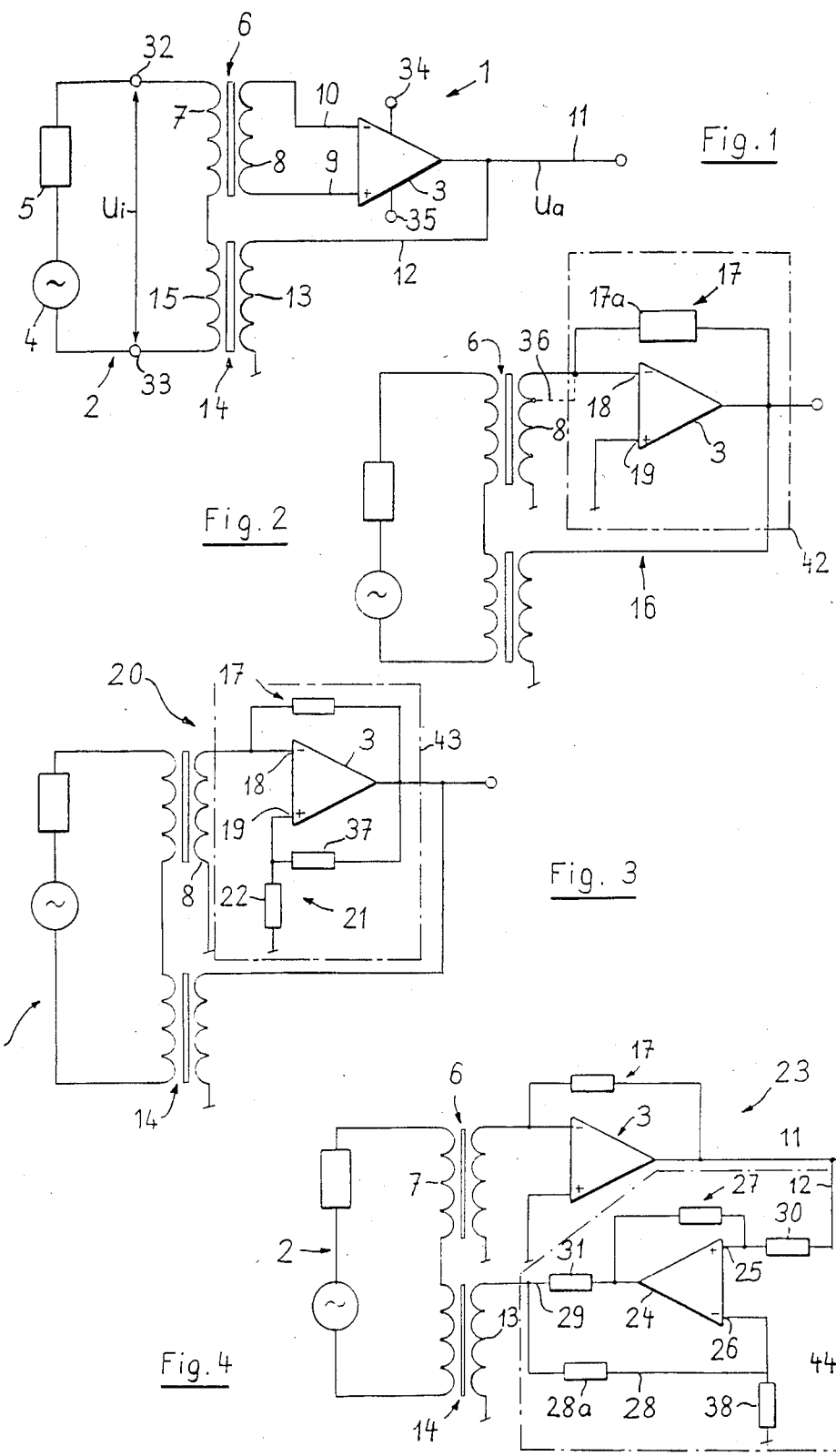

LOW-DISTORTION AUDIO AMPLIFIER CIRCUIT ARRANGEMENT

BACKGROUND OF THE INVENTION

The present invention relates to a new and improved construction of a low-distortion audio amplifier circuit arrangement.

In its more particular aspects, the present invention relates to a new and improved construction of a low-distortion audio amplifier circuit arrangement comprising an amplifier, a source circuit containing a current-voltage source, and a transformer operatively connecting the source circuit to the amplifier.

Such amplifier circuit arrangements serve the purpose of amplifying audio signals with the least possible distortions and at the smallest possible distortion factor. Distortions of the audio signal occur in such amplifier arrangements both in the transformer as well as in the amplifier connected thereto. The distortions caused by the amplifier can be prevented in known manner by measures effective within and at the amplifier. The present invention is not concerned with preventing the distortion caused by the amplifier, but concerns itself with distortions which are caused by the transformer.

In an amplifier circuit arrangement as known, for example, from U.S. Pat. No. 3,828,269, granted Aug. 6, 1974, the magnetic operative control range of the transformer is maintained very small in order to eliminate to the greatest possible extent transformer-caused distortions. This is achieved by a negative or inverse feedback circuit interconnecting an output of the amplifier in the amplifier circuit arrangement and the transformer. Accordingly, the transformer is provided with negative or inverse feedback windings. The small magnetic operative control range of the transformer induces a small voltage in the winding associated with the source circuit and this, in turn, results in a very low input resistance of the amplifier circuit arrangement.

It is a disadvantage of such circuit arrangement that the input resistance thereof is too small for amplifying audio signals which originate from a signal source like, for example, a microphone. It would be conceivable to correctly match the output resistance of the microphone to the input resistance of the amplifier circuit arrangement by incorporating a suitable resistor in the source circuit. The input resistance could thus be increased to the desired degree. However, such matching, in turn, has the disadvantage that such resistor would generate noise which subsequently is further amplified by the amplifier and such is unacceptable in the case of audio signals.

In a further amplifier circuit arrangement as known, for example, from U.S. Pat. No. 3,656,831, granted Apr. 18, 1972, the source circuit is connected to an amplifier circuit via two transformers which are wound in a trifilar manner. The output of the amplifier circuit is again connected via a transformer. The amplifier circuit essentially comprises a main amplifier and an error amplifier. The arrangement aims at correcting distortions which are generated in the main amplifier. This amplifier circuit arrangement is predominantly used in the carrier frequency field which relates to the transmission of broad-band signals in lines or conductors.

Such amplifier circuit arrangement is unsuited for amplifying audio signals because the amplifier circuit arrangement has a low input impedance. The output impedance which must be low for processing audio signals, however, cannot be maintained sufficiently low in such amplifier circuit arrangement because the output circuit and one of the two transformers are connected in series in the source circuit. The input impedance and the output impedance of this amplifier circuit arrangement must be matched to the impedance of the related transmission line which means that the impedances are equal. Such equality of impedances cannot be used in audio signal amplifier circuit arrangements.

It is further known to prevent distortions generated by a transformer by designing the transformer to possess a large size and to be heavy in weight. However, such solution to the problem is undesirable in view of the trend towards miniaturizing electronic equipment.

SUMMARY OF THE INVENTION

Therefore, with the foregoing in mind it is a primary object of the present invention to provide a new and improved construction of a low-distortion audio amplifier circuit arrangement which is suitable for signal sources of a large volume or dynamic range.

Another and more specific object of the present invention is directed to the prevision of a new and improved construction of a low-distortion audio amplifier circuit arrangement which permits the use of a small, light-weight and inexpensive transformer without having to accept distortions or noise due to the use of such a transformer.

Now in order to implement these and further objects of the invention, which will become more readily apparent as the description proceeds, the amplifier circuit arrangement of the present development is manifested by the features that, the amplifier is provided with a negative or inverse feedback circuit which is connected back with the source circuit, and this negative or inverse feedback circuit is connected to the source circuit by means of a further transformer connected in series to the current-voltage source in the source circuit.

It is one of the advantages achieved by the invention that in such an amplifier circuit arrangement the transformers can by operated in such a manner that non-linearities of the transformer cores do not become effective. As a result, the transformers can be of a small-size, light-weight and inexpensive design. During the use of such an amplifier arrangement the amplifier therein can also be shielded from high common mode voltages. The complete isolation enables individual protective grounding of the interconnected apparatus components. At low frequencies there are obtained in this manner distortion factor values which are lower by a factor in the range of 10 to 1000 in comparison to known circuit arrangements which are provided with a completely isolated source circuit. The inherent noise of the circuit arrangement can be made insignificantly small by appropriate selection of the components. The transformers used in the source circuit can be designed approximately four times smaller and lighter and seven times less expensive as compared to a single transformer which is solely dimensioned in such a manner as to prevent the distortions which are generated by such transformer.

BRIEF DESCRIPTION OF THE DRAWINGS

The invention will be better understood and objects other than those set forth above, will become apparent when consideration is given to the following detailed description thereof. Such description makes reference FIG. 1 is a circuit diagram of a first embodiment of the inventive audio amplifier circuit arrangement;

FIG. 2 is a circuit diagram of a second embodiment of the inventive audio amplifier circuit arrangement;

FIG. 3 is a circuit diagram of a third embodiment of the inventive audio amplifier circuit arrangement;

FIG. 4 is a circuit diagram of a fourth embodiment of the inventive amplifier circuit arrangement;

DETAILED DESCRIPTION OF THE PREFERRED EMBODIMENTS

Figure 5:
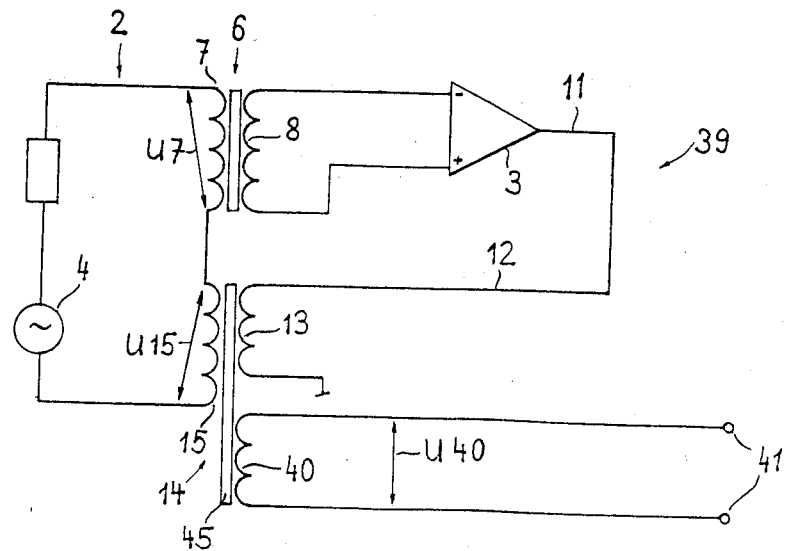
FIG. 5 is a circuit diagram of a fifth embodiment of the inventive audio amplifier circuit arrangement.

Describing now the drawings, it is to be understood that only enough of the construction of the audio amplifier circuit arrangement has been shown as needed for those skilled in the art to readily understand the underlying principles and concepts of the present development, while simplifying the showing of the drawings. Turning attention now specifically to FIG. 1, there has been schematically illustrated therein by means of a circuit diagram a first exemplary embodiment of the inventive audio amplifier circuit arrangement. This amplifier circuit arrangement 1, shown in FIG. 1, comprises a source circuit 2 and an amplifier 3. The source circuit 2 comprises a current-voltage source 4 and a resistor 5. The current-voltage source 4 may be constituted by, for example, an electro-mechanical transducer like, for example, a microphone or any other suitable signal source.

A transformer or coupling transformer 6 provides an interconnection or coupling between the amplifier 3 and the current-voltage source 4. A primary winding 7 of the transformer 6 is connected in the source circuit 2 and the secondary winding 8 of this transformer 6 is connected to the amplifier 3 by means of lines or conductors 9 and 10. These lines or conductors 9 and 10 and the secondary winding 8 of the transformer 6 thus conjointly form with the amplifier 3 an input circuit.

The amplifier 3 possesses supply connectors 34 and 35 in a manner which is known as such. An output 11 of the amplifier 3 is connected via a line or conductor 12 to a primary winding 13 of a further transformer 14. The secondary winding 15 of this further transformer 14 is connected in series to the primary winding 7 of the transformer 6 in the source circuit 2. The line or conductor 12 forms conjointly with the further transformer 14 a negative or inverse feedback circuit for the amplifier 3.

In the source circuit 2 the secondary winding 15 serves the purpose of forming a counter-voltage countering a voltage Ui as it occurs between terminals 32 and 33 of the source circuit 2. This counter voltage, in turn, is generated by an output voltage Ua which appears at the output 11 of the amplifier 3 and thus is applied to the primary winding 13 of the further transformer 14. Due to this arrangement the input impedance of the source circuit 2 is high. The amplifier curcuit arrangement 1 possesses only the small winding resistances of the windings associated with the transformer 6 and with the further transformer 14 and, therefore, such amplifier circuit arrangement 1 possesses low-noise characteristics.

The amplifier 3 is a high-gain amplifier. A low voltage therefore can be applied across the secondary winding 8, which means that the transformer 6 is magnetically controlled only to a very small degree and thus generates only very small distortion. The further transformer 14 generates only small distortions because the primary winding 13 thereof is operated at the constant amplifier output voltage Ua. The non-linear magnetization currents required for the high degree of the magnetic operative control of the further transformer 14 are supplied by the amplifier 3 and during the supply of such currents the output voltage Ua does not become non-linear. Consequently, the further transformer 14 can be operated in such a manner that the magnetization of the core in this further transformer 14 closely approaches the saturation condition. Thus a small, light-weight and inexpensive design can also be selected both for the further transformer 14 as well as for the transformer 6.

When the gain of the amplifier 3 is insufficient, the voltage across the secondary winding 8 of the transformer 6 is not small enough and so the distortions generated by the transformer 6 are not sufficiently small. It may also happen that interfering oscillations are present in the input circuit at sufficiently high degrees of amplification. Both of these effects can be prevented by the second embodiment of the inventive audio amplifier circuit arrangement 16 which is illustrated in FIG. 2 of the drawings.

This amplifier circuit arrangement 16 differs from the amplifier circuit arrangement 1 illustrated in FIG. 1 by a feedback circuit 17 connected with an inverting input 18 of the amplifier 3. Furthermore, the secondary winding 8 of the transformer 6 and the non-inverting input 19 of the amplifier 3 are grounded. An amplifier unit 42 is formed by the amplifier 3 conjointly with the feedback circuit 17.

In principle the amplifier 3, in a manner known as such, possesses a very high input impedance. This is conventional in operational amplifiers. The input impedance can be decreased to any desired extent by introducing a resistor 17a as a negative or inverse feedback element. The input impedance of the amplifier unit 42 is equal to the value of the resistor 17a divided by the gain or amplification of the amplifier 3 which is not negatively or inversely feedback coupled. When the input impedance of this amplifier unit 42 is made negligibly small, the transformer 6 operates in such a manner that the secondary winding 8 thereof is operated in what appears to be a short-circuit. Therefore, the voltage which is induced in the core of the transformer 6 is insignificantly small. As a result, there are not generated any distortions.

In order to obtain as low noise as possible, it is advantageous when the feedback circuit 17 is connected back to a tap 36 of the secondary winding 8 of the transformer 6.

A third embodiment of the inventive audio amplifier circuit arrangement will be evident from FIG. 3. The here illustrated amplifier circuit arrangement 20 comprises an amplifier 3 which is provided with a feedback circuit 17 at one input 18 and a further feedback circuit 21 connected to another input 19 of the amplifier 3. The non-inverting input 19 is connected to ground by means of a resistor 22. An amplifier unit 43 is formed by the amplifier 3 conjointly with the feedback circuits 17 and 21.

The input impedance of the amplifier unit 43 not only can be made zero but also negative by correspondingly dimensioning the feedback circuits 17 and 21. As a result, the winding resistance of, for example, the secondary winding 8 of the transformer 6 can be partially or even completely compensated, which further reduces the distortions generated by the transformer 6. In order to achieve this condition, the following equation must be satisfied:

$$Zcu = -R\,17 \frac{R\,22}{R\,22 + R\,37},$$

wherein R indicates the resistance values of the resistors 17, 22, and 37 as shown in FIG. 3 and Zcu designates the winding resistance of the secondary winding 8 of the transformer 6.

The further transformer 14 still may generate certain distortions if the non-linear magnetization current generates a non-linear voltage drop at the winding resistance of the primary winding 13 in the further transformer 14. As a result, the voltage induced in the source circuit 2 is falsified. Such disadvantage can be countered by using the fourth embodiment of the inventive audio amplifier circuit arrangement which is shown as the amplifier circuit arrangement 23 in FIG. 4 of the drawings.

This amplifier circuit arrangement 23 illustrated in FIG. 4 comprises an amplifier 3 with a feedback circuit 17. The negative or inverse feedback circuit in the amplifier circuit arrangement 23 which leads from the output 11 of the amplifier 3 via the further transformer 14 to the source circuit 2, contains an amplifier 24 having two inputs 25 and 26, each of which is feedback coupled by means of a related feedback circuit 27 and 28 to the output 29 of the amplifier 24. The negative or inverse feedback circuit further comprises an input resistor 30 and a resistor 31. The feedback circuit 28 preferably contains a resistor 28a and is connected to ground by means of a further resistor 38. However, the feedback circuit 28 may also essentially consist only of a line or conductor. A second amplifier unit 44 is formed by the amplifier 24, the feedback circuits 27 and 28 and, if present, the resistors 30 and 31.

Whereas in the amplifier circuit arrangements 1, 16, and 20 as described hereinbefore with reference to FIGS. 1, 2, and 3 of the drawings the primary winding 13 of the further transformer 14 is operated by a constant voltage, which means that the source impedance of the amplifier 3 is zero, the analogous primary winding 13 of the amplifier circuit arrangement 23 is operated by means of a source, that is the second amplifier unit 44 at a negative source impedance Z. This source impedance Z is calculated in accordance with the following equation:

$$Z = -R\,31 \frac{1 + R\,28a/R\,38}{R\,27/R30 - R\,28a/R\,38},$$

wherein R designates the resistance values of the individual associated resistors. The components can be dimensioned such that the negative source impedance Z of the second amplifier unit 44 just compensates the winding resistance of the primary winding 13 in the further transformer 14. In such case the effect is achieved that the non-linear magnetization current does not generate a voltage drop in the primary winding 13 of the further transformer 14. As a consequence, the voltage induced in the further transformer 14 is free of any distortion.

There are also conceivable other designs of the second amplifier unit 44 for generating the aforementioned negative source impedance. One such conceivable design is described in European Patent Publication No. 0,041,472, published Dec. 9, 1981.

A fifth embodiment of the inventive audio amplifier circuit arrangement is shown in FIG. 5 and the amplifier circuit arrangement 39 illustrated therein contains the source circuit 2, the transformer 6, and the further transformer 14. This further transformer 14 comprises an additional winding 40 which is connected to an output 41. The amplifier 3 is connected in known manner to the secondary winding 8 of the transformer 6. The line or conductor 12 connects the output 11 of the amplifier 3 to the one-sided grounded primary winding 13 of the further transformer 14.

In the amplifier circuit arrangement 39 illustrated in FIG. 5, the output voltage of the amplifier 3 is fed back into the source circuit 2 by means of the line or conductor 12 and the primary winding 13 of the further transformer 14. The additional winding 40 again taps-off this output voltage and delivers the same to the output 41.

Already described measures ensure for the amplifier circuit arrangement 39 that the transformer 6 thereof operates without distortion. In all described cases a voltage U7 appearing across the primary winding 7 of this transformer 6 is insignificantly small. Consequently, a voltage U15 appearing across the secondary winding 15 practically is the same as the voltage Ui in the source circuit 2, see FIG. 1. Since the voltage U15 is generated by the magnetization of the core 45 of the further transformer 14, the voltage U40 which is induced in the additional winding 40, as a consequence, is proportional to the voltage U15. Furthermore, since the voltage Ui is equal to U15 and U40 is proportional to U15, there is obtained the result that U40 is proportional to the voltage Ui. Any distortions due to the further transformer 14 are thereby precluded.

All of the aforementioned described arrangements for preventing distortions in the transformer 6 and the further transformer 14 can be combined in any desired manner. Particularly, by combining the amplifier circuit arrangements 20 and 23 there can be conjointly balanced the winding resistances of the secondary winding 8 in the transformer 6 as well as the primary winding 13 in the further transformer 14. There is thus obtained a particularly low-distortion and low-noise amplifier circuit arrangement.

Figure 6:
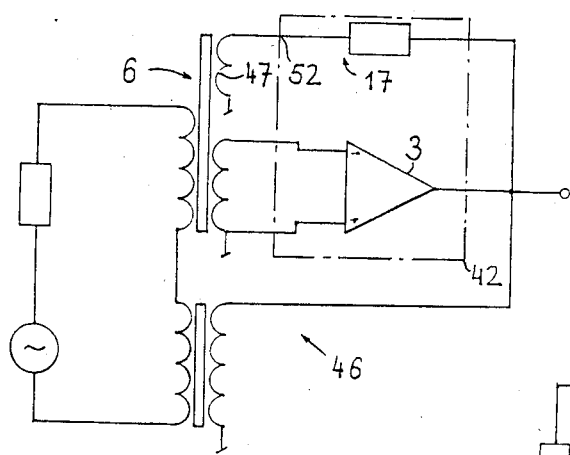
FIG. 6 is a circuit diagram of a sixth embodiment of the inventive audio amplifier circuit arrangement.

As a sixth embodiment of the inventive audio amplifier circuit arrangement there is illustrated in FIG. 6 an amplifier circuit arrangement 46 which can be considered a further variant of the amplifier circuit arrangement 16 which is illustrated in FIG. 2 of the drawings and which has been described hereinbefore with reference to this drawing. In this amplifier circuit arrangement 46 the feedback circuit 17 is coupled back to the transformer 6 by means of a further winding 47. An output 52 of the amplifier unit 42 is provided for interconnecting or coupling the feedback circuit 17 to the additional winding 47. In this amplifier circuit arrangement 46 the magnetic operative control range of the core in the transformer 6 is nulled by means of the current flowing in the additional winding 47. Distortions are thereby eliminated.

Figure 7:
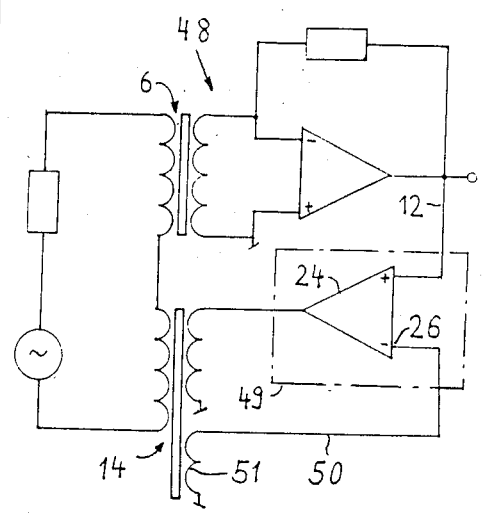
FIG. 7 is a circuit diagram of a seventh embodiment of the inventive audio amplifier circuit arrangement.

A seventh embodiment of the inventive audio amplifier circuit arrangement is formed by the amplifier circuit arrangement 48 which is illustrated in FIG. 7. This amplifier circuit arrangement 48 comprises a second amplifier unit 49 arranged in a negative or inverse feedback circuit. An inverting input 26 of the amplifier 24 in the second amplifier unit 49 is connected via a line or conductor 50 to an additional winding 51 of the further transformer 14. By means of the negative or inverse feedback coupling of the induced voltage in the additional winding 51, non-linear magnetization currents become ineffective. Distortions are thereby made very small.

In amplifier circuit arrangements of the type as described hereinbefore with reference to FIGS. 1 to 7 the transformer 6 must be shielded, something which can be accomplished in any known manner. Due to the inventive arrangement, the transformer has strongly reduced dimensions and thereby the shielding of the transformer 6 is considerably facilitated. Since the voltage applied to the further transformer 14 is controlled by the amplifier 3, this further transformer 14 is practically unaffected by foreign or external fields. Therefore, no shielding is required for such further transformer 14.

While there are shown and described present preferred embodiments of the invention, it is to be distinctly understood that the invention is not limited thereto, but may be otherwise variously embodied and practiced within the scope of the following claims.
ACCORDINGLY,

What I claim is:

1. A low-distortion audio amplifier circuit arrangement comprising:
   an amplifier;
   a source circuit;
   said source circuit containing a current-voltage source;
   a transformer operatively interconnecting said amplifier and said source circuit;
   a negative feedback circuit operatively associated with said amplifier and coupled back to said source circuit;
   a further transformer connected in series with said current-voltage source; and
   said further transformer coupling said negative feedback circuit to said current-voltage source of said source circuit.

2. The amplifier circuit arrangement as defined in claim 1, further including:
   an amplifier unit; and
   said amplifier constituting a component of said amplifier unit.

3. The amplifier circuit arrangement as defined in claim 2, wherein:
   said amplifier unit possesses a negligibly low input impedance.

4. The amplifier circuit arrangement as defined in claim 2, wherein:
   said transformer comprises a secondary transformer winding possessing a predetermined winding resistance; and
   said amplifier unit possesses a negative input impedance which at least partially compensates said winding resistance of said secondary transformer winding.

5. The amplifier circuit arrangement as defined in claim 1, further including:
   a first amplifier unit;
   said amplifier constituting a component of said first amplifier unit and possessing an output;
   a second amplifier unit;
   said second amplifier unit constituting a component of said negative feedback circuit and possessing an input and an output;
   said further transformer possessing a primary winding;
   said output of said second amplifier unit being connected to said primary winding of said further transformer; and
   said input of said second amplifier unit being connected to said output of said amplifier constituting a component of said first amplifier unit.

6. The amplifier circuit arrangement as defined in claim 5, wherein:
   said primary winding of said further transformer defines a winding resistance; and
   said second amplifier unit possessing a negative source impedance which at least partially compensates said winding resistance of said primary winding of the further transformer.

7. The amplifier circuit arrangement as defined in claim 1, further including:
   an amplifier circuit possessing an output;
   said amplifier constituting a component of said amplifier circuit;
   said further transformer comprising an additional winding; and
   said additional winding of said further transformer being connected to said output of said amplifier circuit.

8. The amplifier circuit arrangement as defined in claim 2, wherein:
   said amplifier unit possesses an output and a feedback circuit connected to said output of said amplifier unit;
   said transformer comprising an additional winding; and
   said output of said amplifier unit being connected to said additional winding of said transformer.

9. The amplifier circuit arrangement as defined in claim 5, wherein:
   said second amplifier unit comprises an amplifier having an input;
   said further transformer comprising an additional winding; and
   said amplifier input of said amplifier contained in said second amplifier unit being connected to said additional winding of said further transformer.

10. The amplifier circuit arrangement as defined in claim 2, further including:
    a further negative feedback circuit;
    said amplifier unit comprising an inverting input; and
    said further negative feedback circuit being connected to said inverting input of said amplifier unit.

11. The amplifier circuit arrangement as defined in claim 5, further including:
    a further negative feedback circuit;
    said first amplifier unit comprising an inverting input; and
    said further negative feedback circuit being connected to said inverting input of said first amplifier unit.

12. The amplifier circuit arrangement as defined in claim 11, further including:
    a positive feedback circuit;
    said second amplifier unit comprises a non-inverting input; and
    said positive feedback circuit being connected to said non-inverting input of said second amplifier unit.

* * * * *